(12) United States Patent
Price Lewis et al.

(10) Patent No.: US 9,211,658 B2
(45) Date of Patent: Dec. 15, 2015

(54) COATED MOLDS AND RELATED METHODS AND COMPONENTS

(71) Applicant: GVD Corporation, Cambridge, MA (US)

(72) Inventors: Hilton G. Price Lewis, Lerxington, MA (US); Aleksandr J. White, Arlington, MA (US); Michael E. Stazinski, Pembroke, MA (US)

(73) Assignee: GVD Corporation, Cambridge, MA (US)

( * ) Notice: Subject to any disclaimer, the term of this patent is extended or adjusted under 35 U.S.C. 154(b) by 0 days.

(21) Appl. No.: 14/341,075

(22) Filed: Jul. 25, 2014

(65) Prior Publication Data

US 2015/0151459 A1    Jun. 4, 2015

Related U.S. Application Data

(62) Division of application No. 11/399,694, filed on Apr. 5, 2006, now Pat. No. 8,916,001.

(51) Int. Cl.
*B29D 30/06* (2006.01)
*B29C 33/62* (2006.01)
(Continued)

(52) U.S. Cl.
CPC ............... *B29C 33/62* (2013.01); *B29C 33/56* (2013.01); *B29C 33/58* (2013.01);
(Continued)

(58) Field of Classification Search
CPC ........ B29C 33/10; B29C 33/42; B29C 33/62; B29C 33/56; B29C 33/58; B29D 30/0607; B29D 30/0616; B29D 2030/0607; B29D 2030/0616; B29D 30/0606; C23C 16/44; C23C 16/46; C23C 16/463; C23C 16/56
See application file for complete search history.

(56) References Cited

U.S. PATENT DOCUMENTS 1,735,916 A    11/1929    Boerder
2,610,606 A     9/1952    Weber
(Continued)

FOREIGN PATENT DOCUMENTS

CA    2289137    5/2000
DE    3903899    8/1990
(Continued)

OTHER PUBLICATIONS

Critchlow, et al., "A review and comparative study of release coatings for optimized adjesion in rein transfer moulding application", Intl J Adhesion, Accepted Sep. 12, 2005.
(Continued)

*Primary Examiner* — James Mackey
(74) *Attorney, Agent, or Firm* — Pabst Patent Group LLP

(57) ABSTRACT

Molds that have coated mold surfaces, as well as methods and components associated with such molds, are provided. The mold surface coatings may be formed of a polymeric material, such as polytetrafluoroethylene (PTFE), and may be very thin (e.g., 50 microns or less). The coatings may facilitate the release of articles formed in the mold and may also reduce, or eliminate, the build up of contaminants on mold surfaces during processing which, thus, increases mold lifetime. The coatings may be formed in a chemical vapor deposition process with process conditions selected to enable formation of uniform, conformal coatings, even on mold features having small dimensions and/or high aspect ratios. The coatings are particularly well suited to be used in connection with rubber tires molds, though also can be used in other types of molds and articles.

16 Claims, 7 Drawing Sheets

(51) Int. Cl.
*B29C 33/56* (2006.01)
*B29C 33/58* (2006.01)
*C23C 16/458* (2006.01)
*C23C 16/46* (2006.01)
*C23C 16/56* (2006.01)
*B29C 33/42* (2006.01)
*C23C 16/44* (2006.01)

(52) U.S. Cl.
CPC ......... *B29D 30/0606* (2013.01); *C23C 16/458* (2013.01); *C23C 16/46* (2013.01); *C23C 16/463* (2013.01); *C23C 16/56* (2013.01); *B29C 33/42* (2013.01); *B29D 2030/0607* (2013.01); *B29D 2030/0616* (2013.01); *C23C 16/44* (2013.01)

(56) References Cited

U.S. PATENT DOCUMENTS

| | | | |
|---|---|---|---|
| 3,279,936 A * | 10/1966 | Forestek | 428/327 |
| 3,416,934 A | 12/1968 | McNair | |
| 3,595,950 A | 7/1971 | Mezynski | |
| 3,747,166 A | 7/1973 | Eross | |
| 3,891,363 A | 6/1975 | Sievers | |
| 3,979,543 A * | 9/1976 | Higbee | 428/331 |
| 3,990,906 A | 11/1976 | Johnston | |
| 4,072,456 A | 2/1978 | Appel | |
| 4,184,880 A | 1/1980 | Huber | |
| 4,329,265 A | 5/1982 | Hallenbeck | |
| 4,501,616 A | 2/1985 | Fink | |
| 4,553,918 A * | 11/1985 | Yoda et al. | 425/46 |
| 4,737,222 A | 4/1988 | Cardenas | |
| 4,857,397 A | 8/1989 | Mowdood | |
| 4,863,650 A | 9/1989 | Kohler | |
| 4,869,922 A | 9/1989 | DAgostino | |
| 4,970,986 A | 11/1990 | Anthony | |
| 5,160,544 A | 11/1992 | Garg | |
| 5,264,039 A | 11/1993 | Gobush | |
| 5,380,557 A * | 1/1995 | Spiro | 427/249.7 |
| 5,454,586 A | 10/1995 | Rogerson | |
| 5,466,742 A | 11/1995 | Wagner | |
| 5,618,336 A | 4/1997 | Wagner | |
| 5,738,813 A | 4/1998 | Naganawa | |
| 5,833,753 A | 11/1998 | Herlinger | |
| 5,888,591 A | 3/1999 | Gleason | |
| 5,919,290 A | 7/1999 | Ishikawa | |
| 5,997,650 A | 12/1999 | Herlinger | |
| 6,096,248 A | 8/2000 | Fraser | |
| 6,427,622 B2 | 8/2002 | Madan | |
| 6,554,037 B2 | 4/2003 | Bataille | |
| 6,592,726 B1 | 7/2003 | Hashimoto | |
| 6,692,574 B1 | 2/2004 | Tolt | |
| 6,716,012 B2 | 4/2004 | Yovichin | |
| 7,090,735 B2 * | 8/2006 | Neugebauer et al. | 156/110.1 |
| 7,481,257 B2 * | 1/2009 | Matsumura | 152/209.2 |
| 2001/0047758 A1 | 12/2001 | Matthee | |
| 2001/0051677 A1 | 12/2001 | Bataille | |
| 2003/0010290 A1 | 1/2003 | Matthee | |
| 2004/0177927 A1 | 9/2004 | Kikuchi | |
| 2005/0110194 A1 | 5/2005 | Ebiko | |

FOREIGN PATENT DOCUMENTS

| | | |
|---|---|---|
| EP | 0374080 | 6/1990 |
| EP | 0531029 | 3/1993 |
| EP | 0841140 | 5/1998 |
| GB | 1126748 | 9/1968 |
| GB | 2210576 | 6/1989 |
| GB | 2351691 | 1/2001 |
| JP | 60016419 | 1/1985 |
| JP | 60137611 | 7/1985 |
| JP | 10329141 | 12/1998 |
| JP | 11198150 | 7/1999 |
| JP | 2964263 | 10/1999 |
| JP | 2000158454 | 6/2000 |
| JP | 2000202835 | 7/2000 |

OTHER PUBLICATIONS

European Office Action from EP 07 754 647.1, mailed May 18, 2009.
Furukawa, "Prevention of mould fouling with various rubbers 4. Flurorobbers", Intl. Polymer Sci and Technol., 13(1)(1996).
Hanazono, "Mold coatings to prevent fouling", Intl Polymer Sci and Technol., 12(12) (1985).
"Xylan® Product Literature", published prior to Apr. 15, 2006.

* cited by examiner

COATED MOLDS AND RELATED METHODS AND COMPONENTS

CROSS-REFERENCE TO RELATED APPLICATIONS

This application is a divisional of copending U.S. patent application Ser. No. 11/399,694, filed Apr. 5, 2006.

FIELD OF INVENTION

The invention relates generally to coating technology and, more particularly, to rubber tire molds having coated mold surfaces, as well as methods and components associated with coatings.

BACKGROUND OF INVENTION

Rubber compounds may be vulcanized within a mold to form a molded article. For example, a rubber tire can be formed by pressing a tire blank into mold surfaces and heating under pressure to vulcanize the rubber and to form tire features (e.g., treads) defined by corresponding mold surface features. The molded tire is released from the mold surfaces in a de-molding step. In some cases, the molded tire may stick to the mold surfaces which can increase de-molding times and can lead to uneven de-molding which can damage the molded tire. The sticking may be the result of the relatively complex shape of certain tire mold surfaces. Also, contamination (e.g., sulfur, zinc salts, oils and waxes) which is deposited on mold surfaces during the vulcanization, can enhance sticking. Such contamination may also damage mold surfaces which can lead to formation of defects on surfaces of the molded tires.

Molds may be periodically cleaned or reconditioned to remove contamination, for example, using a bead blasting techniques. However, such techniques may damage mold surfaces by creating pits or other defects. In some cases, molds may only be reconditioned a limited number of times prior to being unsuitable for use.

Other solutions have been proposed to reduce mold sticking and/or to mitigate the build up of contamination on mold surfaces. For example, one technique has involved spraying a solvent-based silicon release agent on mold surfaces. However, this can form a caramelized surface on the mold over time which may contribute to build up of contamination and loss of surface finish. Other techniques have formed coatings (e.g., polymeric material coatings) on mold surfaces. A conventional approach for forming such coatings has been to utilize spray and dip techniques. However, such techniques may not be able to form conformal coatings of relatively constant thickness on mold surface features having small widths and/or high aspect ratios. Instead, coatings formed using such techniques may lead to coating thickness variations across certain mold features and/or may not conformally coat the entire mold surface that defines certain features as shown schematically in FIG. 1. This impairs the ability to form small features on molded tires with desired accuracy using molds coated with such techniques. Furthermore, such techniques can lead to blockage of vent holes in the mold that are important to ensure proper release of vapors during vulcanization. Consequently, such techniques may require that vent holes be manually opened after the coating process.

SUMMARY OF INVENTION

Molds having coated mold surfaces, as well as methods and components, associated with coatings are provided.

In one aspect, a tire mold is provided. The tire mold comprises a mold surface including a portion defining a feature having a cross-sectional width of less than 10 mm and an aspect ratio of greater than 1.0. The portion includes a region of the mold surface adjacent to the feature. The tire mold further comprises a coating formed on the portion of the mold surface. The coating comprises a fluorocarbon polymer and has a thickness of less than 25 microns across the portion. The thickness of the coating varies by less than 10 microns across the portion.

In another aspect, a method of coating a tire mold is provided. The method comprises forming gaseous fluorocarbon monomer species; and, depositing the monomer species to form a coating on a portion of a tire mold surface. The portion defines a feature having a cross-sectional width of less than 10 mm and an aspect ratio of greater than 1.0. The portion includes a region of the mold surface adjacent to the feature. The coating comprises a fluorocarbon polymer and has a thickness of less than 25 microns. The thickness of the coating varies by less than 10 microns across the portion.

In another aspect, a system for depositing a coating on a surface of an article is provided. The system comprises a deposition chamber and a filament assembly positioned within the deposition chamber. The filament assembly comprises a first frame portion and a second frame portion. The filament assembly further comprises a plurality of filament segments extending between the first frame portion and the second frame portion to form a non-planar filament array.

In another aspect, a system for depositing a coating on a surface of an article is provided. The system comprises a deposition chamber; and a supporting device constructed and arranged to support the article in the deposition chamber. The supporting device includes an extruded metal piece designed to support at least a portion of the article. The extruded metal piece has a channel formed therein that extends along a length of the extruded metal piece.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides molds that have coated mold surfaces, as well as methods and components associated with coating. The mold surface coatings may be formed of a polymeric material, such as polytetrafluoroethylene (PTFE), and may be very thin (e.g., 50 microns or less). The coatings may facilitate the release of articles formed in the mold and may also reduce, or eliminate, the build up of contaminants on mold surfaces during processing which, thus, increases mold lifetime. The coatings may be formed in an initiated chemical vapor deposition (i-CVD) process with process conditions selected to enable formation of uniform, conformal coatings, even on mold portions including mold features having small widths and/or high aspect ratios, as described further below. The coatings are particularly well suited to be used in connection with rubber tires molds, though also can be used in other types of molds and other types of articles.

Figure 1:
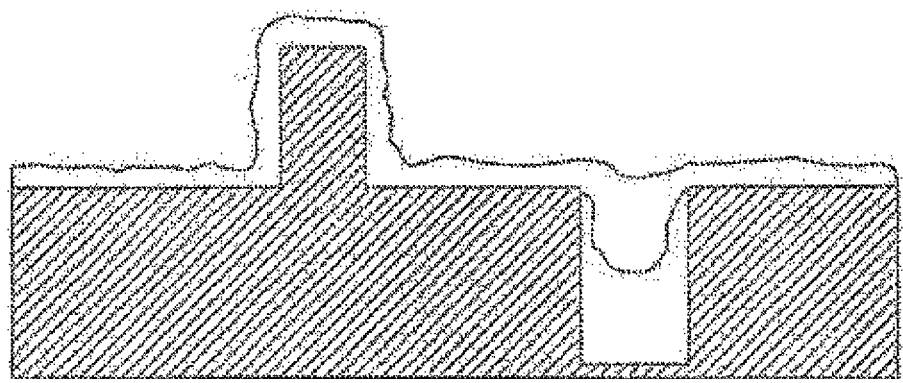
FIG. 1 shows a representation of a tire mold coated according to a conventional technique.
Figure 2A:
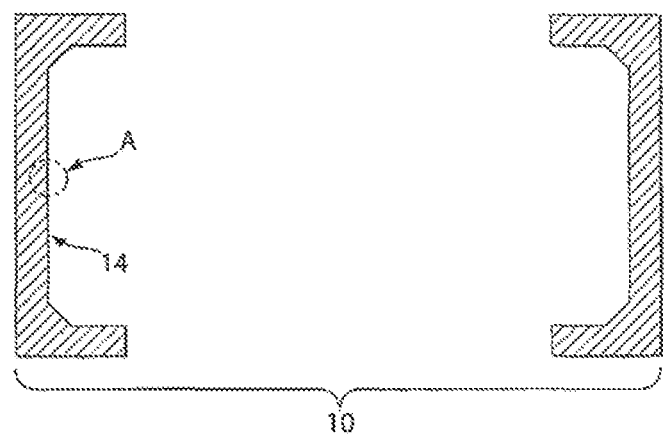
FIG. 2A shows a coated tire mold according to one embodiment of the present invention.
Figure 2B:
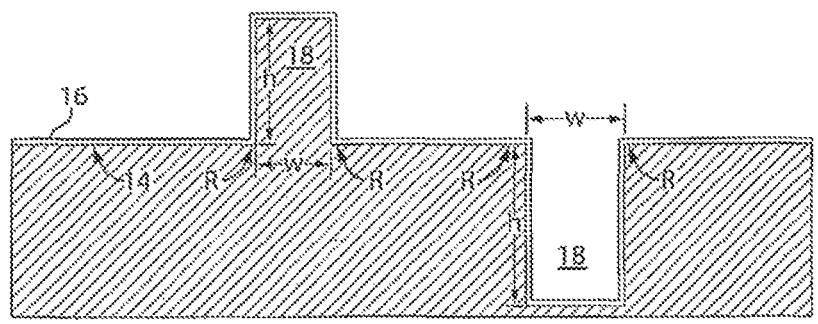
FIG. 2B shows a cross-section of a portion (A) of the coated tire mold of FIG. 2A according to an embodiment of the present invention.

FIG. 2A shows a tire mold 10 according to an embodiment of the invention. The tire mold includes mold surfaces 14. As shown in FIG. 2B, a coating 16 is formed on the mold surfaces. As described further below, the coating may conform to a mold feature 18 that has a small cross-sectional width (w) and/or a high aspect ratio (h/w) such that the coating thickness remains relatively uniform. Thus, the mold enables accurate formation of tire features having corresponding dimensions. Amongst other advantages, the coating may increase lubricity (e.g., by reducing coefficient of friction of mold surface), enhance release from the mold surface, reduce the formation of contamination on mold surfaces, enhance chemical resistance, and lower surface energy.

The tire mold has dimensions that provide the desired tire product. For example, the tire mold may be sized to produce tires having a width between about 150 mm and 500 mm; and, in some cases, between 180 mm and 300 mm. The tire mold may have a radius of between 200 mm and 500 mm. The tire mold may be formed of any suitable material used in the art including metals such as aluminum or stainless steel.

In general, the coating may be formed of any suitable polymeric material. Examples of coating materials include polymeric materials such as fluorocarbon polymeric materials (e.g., PTFE), polyoxymethylene, crosslinked siloxanes, vinyl polymers (e.g., methacrylates, acrylates, styrenic polymers) and co-polymers of these materials. Suitable coating material compositions have been described, for example, in U.S. Pat. No. 5,888,591 which is incorporated herein by reference.

In some embodiments, it may be particularly preferred for the coating material to comprise PTFE. PTFE coating materials may be particularly well-suited in providing the above-described advantages including increasing lubricity (e.g., by reducing coefficient of friction of mold surface), enhancing release from the mold surface, reducing the formation of contamination on mold surfaces, enhancing chemical resistance, and lowering surface energy. For example, in these embodiments, the compositional $CF_2$ fraction (i.e., atomic fraction) of the coating material may be at least about 50%; in some cases, at least about 75%; in some cases, at least about 90%; and, in some cases, at least about 95%. In some of these embodiments, the fluorine to carbon ratio (F/C ratio) is between about 1.1/1 to 2.2:1. In some cases, the coating material consists essentially of PTFE, or consists of PTFE. In some embodiments, the coating material compositions (e.g., PTFE compositions) are formed during deposition and do not need to undergo additional steps (e.g., curing) to form the final composition. Thus, these coating materials may be uncured.

The coating may have any suitable thickness, though in certain embodiments, it is preferable that the coating is very thin. For example, the coating may have a thickness of less than 50 microns. In some embodiments, it is preferable that the coating be even thinner. For example, the coating may have a thickness of less than 25 micron; a thickness of less than 10 micron; a thickness of less than 5 micron; a thickness of less than 2 micron; and, even, a thickness of less than 1 micron. In some cases, it may be preferable for the coating to have a thickness of greater than 10 nm (or greater than 100 nm), for example, to ensure sufficient coverage. It should be understood, however, that other thicknesses may be suitable.

Advantageously, coating methods of the invention, as described further below, can provide coatings that strongly adhere to mold surfaces. Such adherence enhances the ability to coat mold features having small cross-sectional widths and/or high aspect ratios.

In some embodiments, it is preferable that the coating be formed on substantially the entire mold surface area. That is, substantially all of the area of the mold surfaces that defines the mold cavity is coated. However, in certain embodiments, only a portion of the mold surface is coated.

As described further below, methods of the invention enable forming the coating on mold features having small cross-sectional widths. As used herein, a cross-sectional width of a feature is a lateral cross-sectional distance across the portion of the feature between mold surface portions adjacent the feature (i.e., width at h=0). The width is indicated as (w) in FIG. 2B. For example, such mold features may have cross-sectional widths of less than 10 mm, less than 5 mm, less than 1 mm, less than 250 micron, or even less than 100 micron. In some cases, it is preferable that the cross-sectional widths of the mold features are greater than 50 micron to facilitate formation of the mold features, however it should be understood that the invention is not limited in this regard.

In some embodiments, the mold features may have high aspect ratios which may be in combination with, or separate from, the small cross-sectional widths noted above. As used herein, aspect ratio is defined as the feature height (h) divided by the cross-sectional width (w). Feature height is defined as the vertical distance a feature extends away from a plane defined between mold surface portions adjacent the feature. Feature height is shown as (h) in FIG. 2A. The aspect ratio, for example, may be greater than 1.0; in some cases, the aspect ratio is greater than 2.0; in some cases, the aspect ratio is greater than 10; in some cases, the aspect ratio is greater than 20; and, in some cases, even greater than 50. In some cases, it is preferable that the aspect ratio is less than 1000 to facilitate formation of the mold features, however it should be understood that the invention is not limited in this regard.

A mold feature may include features that deviate from adjacent mold surface portions. For example, the mold features may be an indentation (e.g., hole, groove) that extends into the mold surface, or a protrusion (e.g., post, ridge) that extends upward from the mold surface. In some embodiments, the mold may include both indentations and protrusions.

The mold features having the above-described dimensions may form corresponding features (e.g., portions of a tire tread) on the resulting molded tires. The mold features may also be vent holes which are open to the ambient to release vapor during vulcanization. One aspect of the invention is that the coating may be provided on mold surfaces without clogging the vent holes.

Another aspect of the invention is that the coating may be formed with a relatively constant thickness, even on portions of the mold surface that includes mold features (e.g., indentations or protrusions) having small cross-sectional widths and/or high aspect ratios, and mold surface regions adjacent such features. That is, as shown in FIG. 2A, the coating may be formed with a relatively constant thickness on a portion (P) that includes such a feature and a mold surface region (R) adjacent to such feature. Such portions can include mold surfaces edges (e.g., edges of about 90°) formed between the feature and the adjacent mold region(s). For example, across the portion, the coating thickness may vary by less than 10 microns, less than 5 microns, less than 2 microns, less than 1 micron, or even less than 0.5 micron. In some embodiments, the portion of the mold surface may have a surface area of greater than 1 $cm^2$, 10 $cm^2$; greater than 100 $cm^2$; and, greater than 1,000 $cm^2$. In some embodiments, the portion of the mold surface over which the thickness varies by values noted above is substantially the entire mold surface.

It should be understood that though the embodiment shown in FIGS. 2A-2B is a tire mold, the invention is not limited in this regard. Other embodiments of the invention may include other types of articles which may include features having dimensions described above. In embodiments that involve coating features on articles that are not molds, such features may have cross-sectional widths that are considerably smaller than those noted above, while still maintaining the above-noted thickness variations. For example, the features may have a cross-sectional width of less than 50 micron, less than 10 micron or even less than 5 micron.

Figure 3:
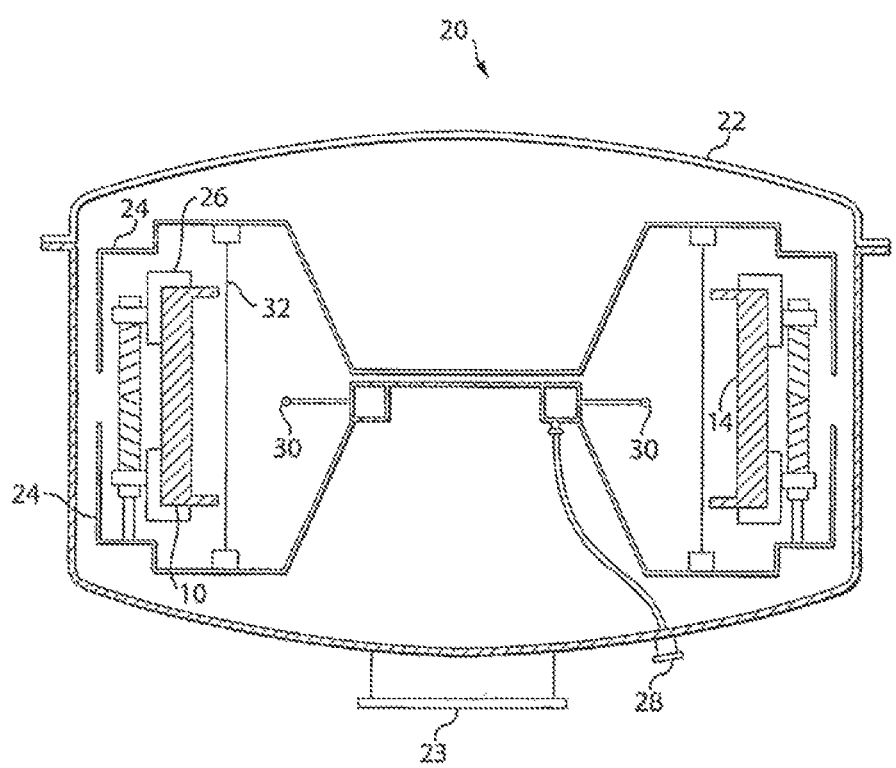
FIG. 3 shows a cross-section of an apparatus for coating tire molds according to an embodiment of the present invention.

FIG. 3 illustrates a coating apparatus 20 according to one embodiment of the present invention. The apparatus may be used, for example, to coat the tire mold shown in FIGS. 2A and 2B. The apparatus includes a vacuum chamber 22 which is maintained at a suitably low pressure by the operation of a vacuum pump system (not shown) connected to an exhaust port 23. In this embodiment, the coating apparatus includes an inner containment structure 24 which at least partially encloses other components including tire mold 10. The tire mold is supported by a supporting device 26 which may be cooled, as described further below. A suitable feed gas, or gas mixture, is supplied through a gas inlet port 28 and distributed within the inner containment structure via a gas distributor 30. In this embodiment, a filament 32 provides heat to create reactive gas species which deposit on the tire mold surfaces to form the coating. As described further below a filament holder 34 may be used to appropriately position the filament relative to the mold surfaces.

It should be understood that the present invention is not limited to the coating apparatus shown in FIG. 3 and that one of ordinary skill in the art would understand that a number of modifications may be made to the apparatus and/or components which still fall within the scope of the present invention.

Vacuum chamber 22 may be formed of any suitable material such as stainless steel or aluminum. The dimensions of the vacuum chamber are selected to enable placement of a tire mold having desired dimensions in to the chamber. For example, the vacuum chamber may have a diameter of between about 30 and about 50 inches, though it should be understood that other dimensions are also possible. In the illustrative embodiment, the vacuum chamber has an annular shape. However, in other embodiments, the vacuum chamber may be rectangular, or have other shapes. In addition to the gas inlet and exhaust ports, the vacuum chamber may be equipped with a number of ports for other purposes including providing access for instruments (e.g., thermocouples) and cooling water.

Gas distributor 30 is designed to ensure sufficient distribution of the feed gas around the mold surfaces to be coated. In the illustrative embodiment, the gas distributor has an annular shape. However, other shapes are also be possible. The distributor has a series of small holes in its outer surface through which gas passes. The number and position of the holes is preferably selected so that the flow rate of gas is relatively uniform over the entire area of the gas distributor. The selection of the number and position of holes may depend on process parameters (e.g., temperature and pressure, amongst others), as known to those of ordinary skill in the art. In certain embodiments, the apparatus may include a flow rate controller to provide additional control over the gas flow rate.

Any suitable type of vacuum pump system may be connected to exhaust port 30. For example, the pumping system may include a roots blower and a rotary vane pump. The pumps operate to provide sufficiently low pressure in the vacuum chamber which may be between about 0.01 Torr and 10 Torr (e.g., 1 Torr).

In the embodiment of FIG. 3, the heat source is filament 32, though other heat sources are possible as described further below. In general, the filament is designed and positioned to provide uniform elevated temperature conditions in the vicinity of the mold surfaces to be coated. The filament may be a wire which is heated by resistive heating. For example, the filament may be connected to a DC voltage source and electrical ground. Suitable filament materials include highly resistive metals such as tantalum, tungsten, rhenium, copper alloys, and nickel-chromium, amongst others. The filament may have any suitable geometry. In some cases, it is preferable that the filament geometry is serpentine over a relatively large area to provide uniform heating in the vicinity of the mold surfaces. However, other filament geometries (e.g., coils) are also possible. In some embodiments, the filament is supported by a filament assembly which is positioned within the coating apparatus.

Figure 4A:
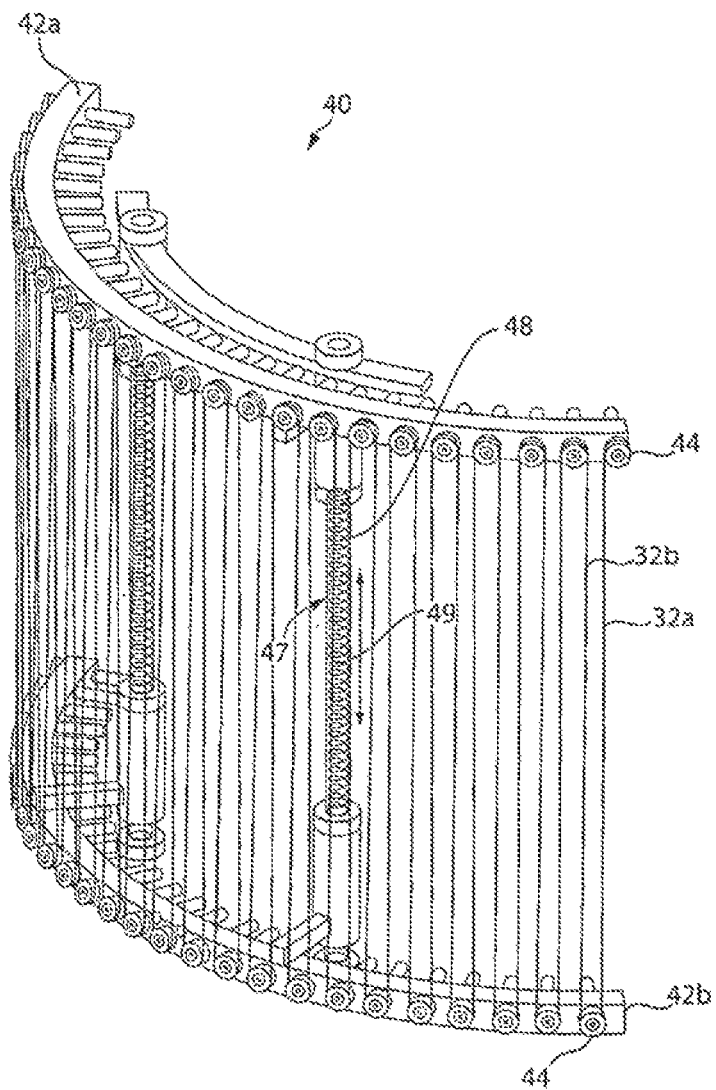
FIG. 4A shows a filament frame assembly according to an embodiment of the present invention.
Figure 4B:
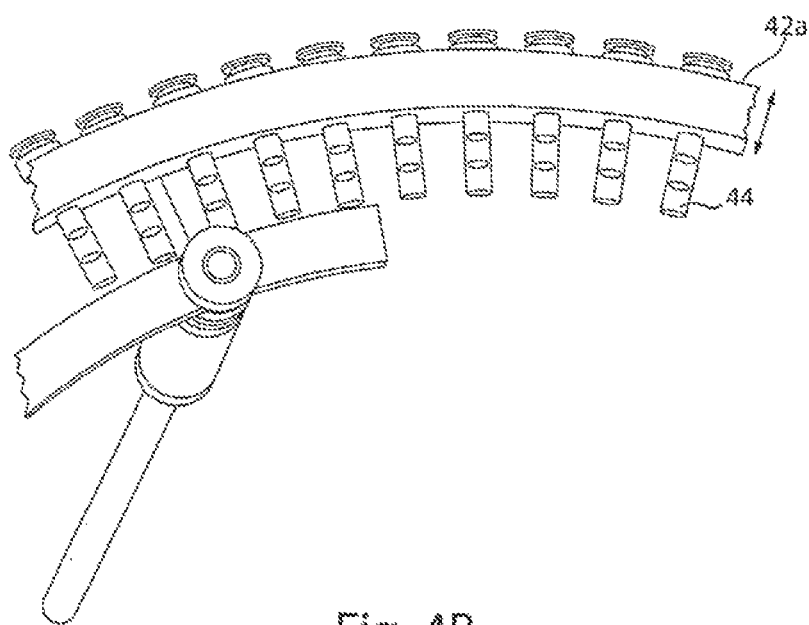
FIG. 4B shows a top view of a portion of the filament frame assembly of FIG. 4A according to an embodiment of the present invention.

FIGS. 4A and 4B show a filament assembly 40 according to one embodiment of the invention. The filament assembly includes a first frame portion 42a and a second frame portion 42b. Filament segments 32a, 32b, etc. extends between pins 44 on the first and second frame portions to form an array. In some embodiments, a single filament is used to form the array of filament segments; though, in other embodiments, individual filaments may form the segments.

The first and second frame portions may be non-planar and lead to the filament array being non-planar. As shown, the first and second frame portions may be curved to conform to the shape of the mold being coated enabling the distance between the filament array (which is also curved) and mold surface to be relatively constant which promotes uniform heating. Thus, in the apparatus of FIG. 3, the filament assembly may have an annular shape that corresponds to the shape of the tire mold.

The pins may be arranged within the first and second frame portions to move back and forth (in the direction of the arrow in FIG. 4B) which allows for additional control over the distance between the filament array and the mold surface. In some embodiments, it is preferred that the distance between the filament array and the mold surface is between 5 mm and 20 mm.

The first and second frame portions may be connected by one or more spring assemblies 47 which include a spring 48 disposed around a rod 49. The first and/or second portions can slide along the rod to increase or decrease the distance between the first and second frame portions over which the filament segments extend to compensate for the expansion/contraction of the filament segments during heating and cooling. Thus, in some embodiments, the spring assembly enables self-adjustment of this distance.

During use, the flow rate of gas may be substantially perpendicular to the filament array. The filament array provides substantially uniform heating conditions to which the reactive gas is exposed.

Though the filament assembly of FIGS. 4A and 4B is described in connection with the tire mold coating apparatus, it should be understood that the filament assembly may be used in connection with other types of coating apparatus which coat other types of articles.

It should also be understood that other types of heating sources may be used in connection with the tire mold coating apparatus of FIG. 3. For example, the heating source may be a hot window, an electrode or other components within the apparatus that are heated (e.g., walls of the vacuum chamber, gas distributor, gas delivery lines, amongst others). In some embodiments, the feed gas may be heated, for example, using an external excitation source such as a laser. In these embodiments, a separate heating source within the apparatus may not be needed.

The mold coating apparatus includes supporting device 26 to support the tire mold. In general, any suitable supporting device may be used including clamping devices. In some cases, it may be preferable for the supporting device to be adjustable to accommodate tire molds having different sizes. That is, the supporting device may be designed to support molds having a range of sizes. It may also be preferable for the supporting device to be capable of cooling the mold surface. As described further below, certain methods of the invention involve maintaining the mold surface to be coated at a relatively cool temperature in relation to the temperature of the feed gases. When cooling is desired, the supporting device may be formed of a thermally conductive material (e.g., metals such as aluminum) which can be cooled using conventional techniques. For example, the supporting device may include channels through which cooling fluid flows.

Figure 5A:
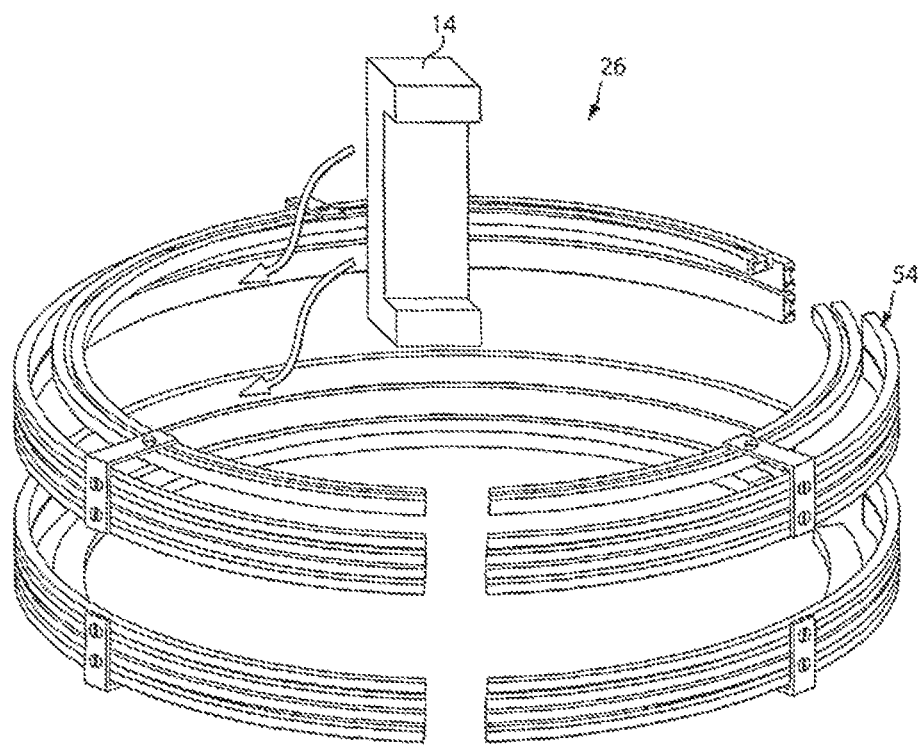
FIG. 5A shows a supporting device that holds tire mold pieces according to an embodiment of the present invention.
Figure 5B:
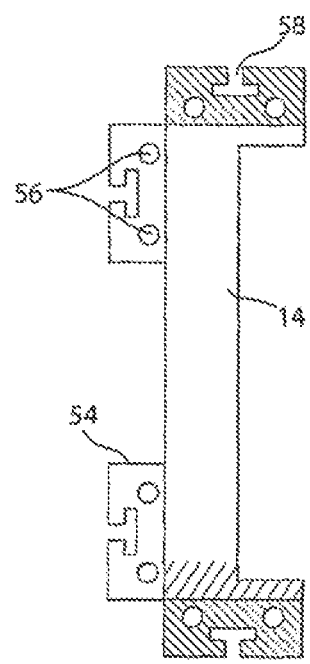
FIG. 5B shows a cross-section of the metal pieces of the supporting device of FIG. 5A according to an embodiment of the present invention.

FIGS. 5A and 5B show supporting device 26 according to one embodiment of the invention. In some cases, the supporting device functions by clamping the mold piece. The supporting device is formed of extruded metal (e.g., aluminum) pieces 54. The pieces have at least one cooling channel 56 formed therein. The cooling channel(s), for example, extend(s) the length of the extruded piece and may be formed during the extrusion process. The pieces may also include a groove 58 to facilitate attachment. The pieces may have any suitable length including greater than 4 inches, greater than 15 inches, greater than 25 inches, or greater than 40 inches. The pieces may be curved to conform to the shape of the tire mold using standard techniques (e.g., rolling). The supporting device may include multiple pieces arranged to extend around different portions of the tire mold in order to uniformly cool the mold and to provide sufficient support. The pieces may be supported at their back surfaces by a clamp or by attachment to other components of the apparatus (e.g., vacuum chamber). The supporting device shown in FIGS. 5A and 5B may be advantageous because it has a simple structure and utilizes inexpensive and readily available extruded metal pieces (e.g., aluminum). Those of ordinary skill in the art know the meaning of, and can identify, extruded metal pieces.

Though the supporting device of FIGS. 5A and 5B is described in connection with the tire mold coating apparatus, it should be understood that the clamping device may be used in connection with other types of coating apparatus which coat other types of articles Methods of the invention may be used to form the mold surface coatings described above. The methods involve introducing a gas, or mixture of gases, into the vacuum chamber. The gas(es) is heated to a desired temperature and decomposes (i.e., pyrolyzes) into reactive species (e.g., radicals) that serve as monomer units. The units migrate to the mold surface, which is at a lower temperature, where the units combine and grow into a coating having desired dimensions. It should be understood that the process parameters (e.g., feed gas composition, gas flow rate, vacuum chamber pressure, filament temperature, mold surface temperature,) may be controlled to deposit a coating having the desired characteristics. The following description of the process parameters relates to certain embodiments of the invention, though it should be understood that the invention is not limited in this regard.

Processes of the invention include certain initiated chemical vapor deposition (iCVD) processes. iCVD processes have been described in U.S. Pat. No. 5,888,591 which is incorporated herein by reference. In general, iCVD processes have different process steps than other conventional CVD processes which may involve heating the substrate which is coated and/or a plasma to generate reactive species, amongst other differences. One advantage of the iCVD process is that the process does not involve "line-of-sight" deposition and that, instead, reactive species are free to penetrate and conform to small features. iCVD processes of the invention are also very well suited to form polymeric material coatings, and in particular the PTFE material coatings described above.

The feed gas composition depends on the composition of the coating being deposited. When forming a fluorocarbon polymeric material, such as PTFE, suitable feed gases include those that decompose (or pyrolyze) to form fluorocarbon (e.g., $CF_2$) monomer units. Examples of feed gases that decompose to form $CF_2$ monomer units include $C_3F_6O$ (HFPO or hexafluoropropylene oxide) $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes such as $CF_2Br$, $CF_2HBr$, $CF_2HCl$, $CF_2Cl_2$ and $CF_2FCl$, difluorocyclopropanes such as $C_3F_6$, $C_3F_4H_2$, $C_3F_2Cl_4$, $C_2F_3Cl_3$ and $C_3F_4Cl_2$, trifluoromethylfluorophosphanes such as $(CF_3)_3PF_3$, $(CF_3)_3PF_3$, and $(CF_3)PF_4$; or trifluoromethylphosphino compounds such as $(CF_3)_3P$, $(CF_3)_2P—P(CF_3)_2$, $(CF_3)_2PX$ and $CF_3PX_2$, wherein X is F, Cl or H. In some embodiments, it may be preferable to use HFPO feed gas. It is also be possible to use mixtures of the feed gases described above. In some cases, an inert gas (nitrogen, argon) may be added to the feed gas; though, it may be preferable not to add an inert gas to certain feed gases (e.g., HFPO). It should be understood that other feed gases may also be suitable.

The feed gas is introduced into the chamber at a desired flow rate. Suitable flow rates may be between about 0 sccm and 5000 sccm; and, more typically, between about 200 sccm and 5000 sccm. The specific flow rate may depend on a variety of factors including other processing parameters (e.g., chamber pressure), the geometry of the coating apparatus, as well as the desired properties of the coating. During the deposition process, the partial pressure of the feed gas is preferably kept to a sufficiently low level that prevents homogeneous gas-phase reactions, which could form particles in the gaseous environment rather than a coating on the mold surface.

The pressure in the vacuum chamber is generally maintained between about 1 milliTorr and 50 Torr; and, more typically, between about 1 milliTorr and 10 Torr (e.g., about 1 Torr).

In general, the feed gas is heated to a temperature sufficient to decompose (or pyrolyze) to form the desired monomer units. As noted above, a heat source (e.g., a filament) may be used to heat the feed gas. Typical heat source temperatures are between about 200° C. and about 800° C. In some cases, the heat source temperature is greater than about 350° C. It is generally preferable that the temperature of a filament heat source is set to be less than that which causes thermionic emission from the filament.

In general, the mold surface is maintained at a lower temperature than the heat source and the feed gas. Such temperature conditions promote formation of a coating having the desired characteristics. For example, the mold surface may be maintained at a temperature of less than about 200° C., in some cases, less than about 100° C. In some methods, it may be preferable for the temperature of the mold to be between about 10° C. and about 30° C. (e.g., 20° C.) As noted above, the mold surface may be cooled to achieve such temperature conditions.

The reaction conditions are maintained to provide a coating having the desired thickness and other characteristics. The thickness of the coating may be monitored by a sensor placed within the chamber.

In certain methods, it may be preferable to include a post-deposition annealing step. The annealing step may relieve stress in the coating, passivate dangling bonds in the coating, enhance thermal stability of the coating, amongst other advantages. The annealing step may be performed by heating the coating to a temperature between about 50° C. and 400° C. In some methods, the annealing step may be performed in the presence of air or an inert gas (e.g., nitrogen). The annealing step may be conducted in-situ in the coating apparatus.

In some embodiments, it may be preferable to treat the mold surface prior to coating deposition to promote adhesion of the monomer units. Pre-treatment may include exposing the mold surface to a plasma and/or spraying an adhesion promoting layer on the mold surface. In some methods, an adhesion promoting layer can be vapor-deposited in situ in the deposition chamber prior to deposition of the coating (e.g., fluorocarbon). Examples of suitable adhesion promoters include 1H, 1H, 2H, 2H-Perfluorodecyltriethoxysilane; 1H, 1H, 2H, 2H-Perfluorooctyltriethoxysilane; 1H, 1H, 2H, 2H-Perfluoroalkyltriethoxysilane; perfluorooctyltrichlorosilane; and all classes of vinyl silanes. It should be understood that other adhesion promoters known to those skilled in the art may also be suitable. In some embodiments, it may be desirable not to have an adhesion promoting layer and that the coating is deposited directly on the mold surfaces.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A tire mold comprising:
    a mold surface including a portion defining a feature having a cross-sectional width of less than 10 mm and an aspect ratio of greater than 1.0, the portion including a region of the mold surface adjacent to the feature; and
    a conformal coating formed on the portion of the mold surface, the coating comprising a fluorocarbon polymer and having a thickness of less than 25 microns across the portion, the thickness of the coating varying by less than 10 microns across the portion.

2. The tire mold of claim 1, wherein the coating comprises PTFE.

3. The tire mold of claim 1, wherein the coating thickness is between 10 nm and 10 microns.

4. The tire mold of claim 1, further comprising at least one vent hole formed in the mold surface, wherein the at least one vent hole is not clogged.

5. The tire mold of claim 1, wherein the feature is a protrusion that extends up from the mold surface.

6. The tire mold of claim 1, wherein the feature has a cross-sectional width of less than 1 mm.

7. The tire mold of claim 1, wherein the thickness of the coating formed on the portion varies by less than 2 microns.

8. The tire mold of claim 1, wherein the aspect ratio is greater than 10.

9. A method of producing tires using the tire mold of any one of claims 1, 3, 4, 5, 6, 7, or 8 comprising pressing a tire blank into the tire mold.

10. A method of coating a tire mold comprising:
    forming gaseous fluorocarbon monomer species; and
    depositing the monomer species to form a conformal coating on a portion of a tire mold surface, the portion defining a feature having a cross-sectional width of less than 10 mm and an aspect ratio of greater than 1.0, the portion including a region of the mold surface adjacent to the feature,
    wherein the coating comprises a fluorocarbon polymer and has a thickness of less than 25 microns, the thickness of the coating varying by less than 10 microns across the portion.

11. The method of claim 10, wherein the step of forming the fluorocarbon monomer species is by decomposing a feed gas.

12. The method of claim 11, wherein the decomposing of the feed gas is by a heating source which comprises a filament array.

13. The method of claim 12, wherein the filament array has a non-planar shape.

14. The method of claim 10, wherein the tire mold surface is maintained at a temperature of less than 200° C.

15. The method of claim 10, wherein the tire mold surface is maintained at a temperature of less than the temperature of the gaseous fluorocarbon monomer species.

16. The method of claim 10, wherein the coating comprises PTFE.

* * * * *